(12) United States Patent
Zhang

(10) Patent No.: US 9,620,567 B2
(45) Date of Patent: Apr. 11, 2017

(54) OLED BACKBOARD, METHOD OF MANUFACTURING THE SAME, ALIGNMENT SYSTEM AND ALIGNMENT METHOD THEREOF

(71) Applicants: BOE Technology Group Co., Ltd., Beijing (CN); Ordos Yuansheng Optoelectronics Co., Ltd., Inner Mongolia (CN)

(72) Inventor: Jinzhong Zhang, Beijing (CN)

(73) Assignees: BOE Technology Group Co., Ltd., Beijing (CN); Ordos Yuansheng Optoelectronics Co., Ltd., Ordos, Inner Mongolia (CN)

(*) Notice: Subject to any disclaimer, the term of this patent is extended or adjusted under 35 U.S.C. 154(b) by 0 days.

(21) Appl. No.: 14/785,346

(22) PCT Filed: Feb. 27, 2015

(86) PCT No.: PCT/CN2015/073349
§ 371 (c)(1),
(2) Date: Oct. 18, 2015

(87) PCT Pub. No.: WO2016/058310
PCT Pub. Date: Apr. 21, 2016

(65) Prior Publication Data
US 2016/0254321 A1    Sep. 1, 2016

(30) Foreign Application Priority Data

Oct. 17, 2014    (CN) .......................... 2014 1 0555507

(51) Int. Cl.
*H01L 27/32*    (2006.01)
*H01L 21/77*    (2017.01)
(Continued)

(52) U.S. Cl.
CPC ............ *H01L 27/32* (2013.01); *G06T 7/0004* (2013.01); *G06T 7/73* (2017.01); *H01L 21/681* (2013.01);
(Continued)

(58) Field of Classification Search
CPC ...... H01L 27/32; H01L 51/56; H01L 51/5218
See application file for complete search history.

(56) References Cited

FOREIGN PATENT DOCUMENTS

| CN | 103943651 A | 7/2014 |
|---|---|---|
| CN | 104078404 A | 10/2014 |

(Continued)

OTHER PUBLICATIONS

JP2013131728A English translation.*
(Continued)

*Primary Examiner* — Kyoung Lee
*Assistant Examiner* — Christina Sylvia
(74) *Attorney, Agent, or Firm* — Westman, Champlin & Koehler, P.A.

(57) ABSTRACT

The present disclosure relates to a technical field of OLED display and discloses an OLED backboard, a method of manufacturing the same, an alignment system and an alignment method thereof, which aims to solve a problem of low efficiency in forming an organic light-emitting material layer on the OLED backboard. The OLED backboard comprises: a transparent substrate; at least two functional layers disposed on the upper surface of the transparent substrate and stacked on each other; at least two via holes formed in predefined areas of the at least two functional layers and extending through at least the upper one of the at least two functional layers; and at least two alignment modules located in the at least two via holes respectively, wherein each of the at least two alignment modules comprises at least three first alignment structures arranged in a predefined (Continued)

trace, and a virtual alignment point is allowed to be determined based on the relative position among all the first alignment structures in each of the alignment modules. The efficiency of forming the organic light-emitting material layer on the OLED backboard is thus increased by using the above OLED backboard.

20 Claims, 4 Drawing Sheets

(51) Int. Cl.
　　*H01L 51/56*　　　(2006.01)
　　*G06T 7/00*　　　(2017.01)
　　*H01L 21/68*　　　(2006.01)
　　*H01L 51/52*　　　(2006.01)
　　*H04N 5/372*　　　(2011.01)
　　*G06T 7/73*　　　(2017.01)
　　*H01L 51/00*　　　(2006.01)

(52) U.S. Cl.
　　CPC .......... *H01L 21/77* (2013.01); *H01L 51/5218* (2013.01); *H01L 51/56* (2013.01); *H04N 5/372* (2013.01); *G06T 2207/30148* (2013.01); *H01L 27/3244* (2013.01); *H01L 51/0012* (2013.01)

(56) References Cited

FOREIGN PATENT DOCUMENTS

| | | | |
|---|---|---|---|
| CN | 104103629 A | | 10/2014 |
| CN | 104282623 A | | 1/2015 |
| JP | 2013-131728 A | | 7/2013 |
| JP | 2013131728 A | * | 7/2013 |

OTHER PUBLICATIONS

International Search Report and Written Opinion for PCT Application No. PCT/CN2015/073349, dated Jul. 22, 2015, 9 pages.
English translation of Box No. V of the Written Opinion for the International Searching Authority for PCT Application No. PCT/CN2015/073349, 2 pages.

* cited by examiner

OLED BACKBOARD, METHOD OF MANUFACTURING THE SAME, ALIGNMENT SYSTEM AND ALIGNMENT METHOD THEREOF

CROSS-REFERENCE TO RELATED APPLICATION

This application is a Section 371 National Stage Application of International Application No. PCT/CN2015/073349, filed on Feb. 27, 2015, entitled "OLED Backboard, Method of Manufacturing the same, Alignment System and Alignment Method thereof", which has not yet published, which claims priority to Chinese Application No. 201410555507.3, filed on Oct. 17, 2014, incorporated herein by reference in their entirety.

BACKGROUND OF THE INVENTION

Field of the Invention

Embodiments of the present disclosure relate to the field of OLED display technology, and particularly, to an OLED backboard, a method of manufacturing the same, an alignment system and an alignment method thereof.

Description of the Related Art

In recent years, the organic light emitting diode (hereafter referred to as OLED) display device is widely used in the display field due to some advantages such as self-illumination, wide view angle, fast response, low power consumption, ability of flexible display and the like. An existing OLED display device generally comprises an OLED backboard and an organic light-emitting material layer disposed on the OLED backboard, the organic light-emitting material layer being typically formed by evaporation process, specifically, organic material is evaporated into each of pixel units in pixel areas of the OLED backboard through the evaporation process in which a fine metal mask (hereafter referred to as FMM) is used, so that the required organic light-emitting material layer is formed on the OLED backboard.

During the above forming process of the organic light-emitting material layer, the FMM must be aligned with the OLED backboard such correctly that the organic material will be evaporated into each of pixel units in pixel areas of the OLED backboard correctly. At present, a common alignment means is to dispose several alignment holes in the FMM and several alignment pins on the OLED backboard. Specifically, as shown in FIG. 1, the OLED backboard typically comprises: a transparent substrate 10, a polysilicon layer 16 and a gate insulation layer 11 disposed on the upper surface of the transparent substrate 10, a gate electrode 17 and a dielectric layer 12 disposed on the upper surface of the gate insulation layer 11, source and drain electrodes 18 and a planarization layer 13 disposed on the upper surface of the dielectric layer 12, an anode 19 of the organic light-emitting structure formed on the planarization layer 13 and several alignment pins 20 provided on peripheral edges of the planarization layer 13; correspondingly, several alignment holes are provided in the FMM; the FMM can be aligned with the OLED backboard correctly after each alignment pin 20 is inserted into the respective alignment hole.

However, as the size of the OLED display device increases, the size of the used FMM is correspondingly increased; and the FMM is thin, thus easy to deform during the alignment of the FMM and the OLED backboard, such that it is difficult to use the above alignment method, that is, several adjustments are needed so that it is realized to align the FMM with the OLED backboard correctly, thereby affecting the efficiency of forming the organic light-emitting material layer on the OLED backboard.

SUMMARY OF THE INVENTION

An objective of the present disclosure is to provide an OLED backboard, a method of manufacturing the same, an alignment system and an alignment method, so as to increase the efficiency of forming the organic light-emitting material layer on the OLED backboard.

According to an aspect of embodiments of the present disclosure, it is provided an OLED backboard comprising: a transparent substrate; at least two functional layers disposed on the upper surface of the transparent substrate and stacked on each other; at least two via holes formed in predefined areas of the at least two functional layers and extending through at least the upper one of the at least two functional layers; and at least two alignment modules located in the at least two via holes respectively, wherein each of the at least two alignment modules comprises at least three first alignment structures arranged in a predefined trace, and a virtual alignment point is allowed to be determined based on the relative position among all the first alignment structures in each of the alignment modules, and each of the alignment modules is suitable to reflect an incident light from the lower surface of the transparent substrate.

In an optional embodiment, each of the via holes extends through the thickness of all the functional layers and communicates with the upper surface of the transparent substrate at its end; the at least two alignment modules are disposed on the upper surface of the transparent substrate directly.

In an optional embodiment, each of the alignment modules comprises three first alignment structures arranged in a rectangle trace, and the center of each of the three first alignment structures corresponds to a corner point of the rectangle trace, respectively.

In an optional embodiment, each of the alignment modules comprises four first alignment structures arranged in a circular trace, and centers of the four first alignment structures quarter the circular trace.

In an optional embodiment, each of the first alignment structure comprises a reflective layer which is formed simultaneously with an anode on the transparent substrate.

In an optional embodiment, the number of the functional layers is three, wherein a function layer disposed on the upper surface of the transparent substrate is a gate insulation layer, a function layer disposed on the upper surface of the gate insulation layer is a dielectric layer and a function layer disposed on the upper surface of the dielectric layer is a planarization layer.

In an optional embodiment, the number of the via holes and the alignment modules is four respectively, and four virtual alignment points determined by the four alignment modules are connectable to each other to form a rectangle.

According to another aspect of embodiments of the present disclosure, it is provided a method of manufacturing an OLED backboard, comprising steps of:

stacking and forming at least two functional layers on an upper surface of a transparent substrate, and forming at least two via holes, which extend through at least the upper one of the at least two functional layers, in predefined areas of the at least two functional layers through a patterning process;

forming a metal film layer in the at least two via holes respectively, then forming patterns of at least two alignment modules in the at least two via holes respectively through one-time patterning process, wherein each of the alignment modules comprises at least three first alignment structures arranged in a predefined trace, and a virtual alignment point is allowed to be determined based on the relative position among all the first alignment structures in each of the alignment modules, and each of the alignment modules is suitable to reflect an incident light from the lower surface of the transparent substrate.

In an optional embodiment, the at least two via holes are formed in predefined areas of all the functional layers through the patterning process so as to extend through the thickness of all the functional layers to the upper surface of the transparent substrate; the metal film layer is formed on the upper surface of the transparent substrate in all the via holes.

In an optional embodiment, the number of the functional layers is three, wherein a function layer formed on the upper surface of the transparent substrate is a gate insulation layer, a function layer formed on the upper surface of the gate insulation layer is a dielectric layer and a function layer formed on the upper surface of the dielectric layer is a planarization layer.

Further, the method of manufacturing the via holes comprises steps of:

forming a pattern including at least two first via hole portions on the gate insulation layer through one-time patterning process after forming the gate insulation layer on the upper surface of the transparent substrate;

forming a pattern including at least two second via hole portions, corresponding to the first via hole portions respectively, on the dielectric layer through one-time patterning process after forming the dielectric layer on the upper surface of the gate insulation layer;

forming a pattern including at least two third via hole portions, corresponding to the second via hole portions respectively, on the planarization layer through one-time patterning process after forming the planarization layer on the upper surface of the dielectric layer;

wherein one first via hole portion, one second via hole portion and one third via hole portion which correspond to each other constitute the via hole.

Further, the first and second via hole portions are formed through one-time patterning process, comprising steps of:

stacking and forming the gate insulation layer and the dielectric layer in sequence on the upper surface of the transparent substrate;

forming at least two first via hole portions extending through the thickness of the gate insulation layer and at least two second via hole portions extending through the thickness of the dielectric layer, the second via hole portions corresponding to the first via hole portions respectively;

wherein, the mask used by the patterning process comprises full-tone mask areas for forming the first and second via hole portions and half-tone mask areas corresponding to pixel areas of the transparent substrate.

In an optional embodiment, in the above method, each of the first alignment structures comprises a reflective layer which is formed simultaneously with an anode on the transparent substrate.

In an optional embodiment, the method of manufacturing the via holes comprises steps of: stacking and forming the gate insulation layer, the dielectric layer and the planarization layer in sequence on the upper surface of the transparent substrate, then forming at least two via holes extending through the gate insulation layer, the dielectric layer and the planarization layer to the upper surface of the transparent substrate through one-time patterning process and by extending etching time.

According to another further embodiment of the present disclosure, it is provided an alignment system for determining whether a fine metal mask (FMM) is aligned with an OLED backboard according to any of the above embodiments, the alignment system comprising:

a CCD camera for taking an alignment image of the FMM and the OLED backboard, the alignment image comprising patterns indicating all the first alignment structures in each of the alignment modules of the OLED backboard and patterns indicating all the second alignment structures on the FMM;

an image processor in a signal connection with the CCD camera, the image processor processing the alignment image captured by the CCD camera to determine a virtual alignment point for each of the alignment modules and a center of the pattern for each of the second alignment structures, so as to decide whether each of the virtual alignment points coincides with the center of the pattern of a respective second alignment structure, and to determine that the FMM has been correctly aligned with the OLED backboard if each of the virtual alignment points coincides with the center of the pattern of the respective second alignment structures.

According to another further embodiment of the present disclosure, it is provided an alignment method in which an alignment system according to the above embodiment is used to realize a correct alignment between the FMM and the OLED backboard, the method comprising steps of:

aligning the second alignment structure on the FMM with the via hole in the OLED backboard according to any of the above embodiments, so as to realize an initial alignment between the FMM and the OLED backboard;

taking an alignment image of the FMM and the OLED backboard by a CCD camera from a side of the OLED backboard away from the FMM, the alignment image including patterns indicating all the first alignment structures in each of the alignment modules of the OLED backboard and patterns indicating all the second alignment structures on the FMM;

processing the alignment image captured by the CCD camera by an image processor to determine a virtual alignment point for each of the alignment modules and a center of pattern for each of the second alignment structures;

deciding whether each of the virtual alignment points coincides with the center of pattern of the respective second alignment structure; and determining that the FMM has been correctly aligned with the OLED backboard if each of the virtual alignment points coincides with the center of pattern of the respective second alignment structure.

In the OLED backboard provided by the present disclosure, each of the alignment modules is disposed on the upper surface of the transparent substrate, and each of the second alignment structures on the FMM is just aligned with the respective via hole when using the FMM. Thus, if the CCD camera shoots from the lower surface of the transparent substrate, the light reflected by each of the first alignment structures and each of the second alignment structures may be directly reflected to the CCD camera from the transparent substrate, thereby reducing the times of reflection and refraction for the light greatly, so that there is a big difference between the grayscale of the patterns of the first alignment structures and the second alignment structures and that of the FMM in the alignment image, and it is thus allowed to distinguish the pattern indicating the FMM with the patterns indicating the first alignment structures and the second alignment structures apparently. Therefore, the times of the alignment between the FMM and the OLED backboard are greatly reduced, thereby increasing the efficiency of forming the organic light-emitting material layer on the OLED backboard apparently.

BRIEF DESCRIPTION OF THE DRAWINGS

The accompanying drawings illustrated here are provided to assist in understanding the present disclosure further and constitute a part of the present disclosure. Exemplary embodiments of the present disclosure and the description thereto are provided to explain the present disclosure and not to limit the present disclosure. In the drawings.

LIST OF REFERENCE NUMERAL

10—transparent substrate; 11—gate insulation layer; 12—dielectric layer; 13—planarization layer; 14—first alignment structure; 15—via hole; 16—polysilicon layer; 17—gate electrode; 18—source and drain electrodes; 19—anode; 20—alignment pin; 30—FMM; 31—second alignment structure; 40—CCD camera; 50—image processor.

DETAILED DESCRIPTION OF PREFERRED EMBODIMENTS OF THE INVENTION

Hereafter, the OLED backboard, the method of manufacturing the same, the alignment system and the alignment method thereof according to the embodiment of the present disclosure are described in detail with reference to the accompanying drawings to explain them further.

Figure 1:
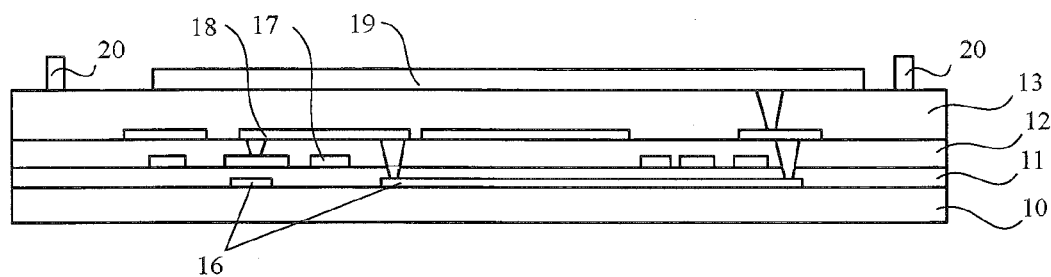
FIG. 1 is a schematic structural view of the OLED backboard in the prior art.
Figure 2:
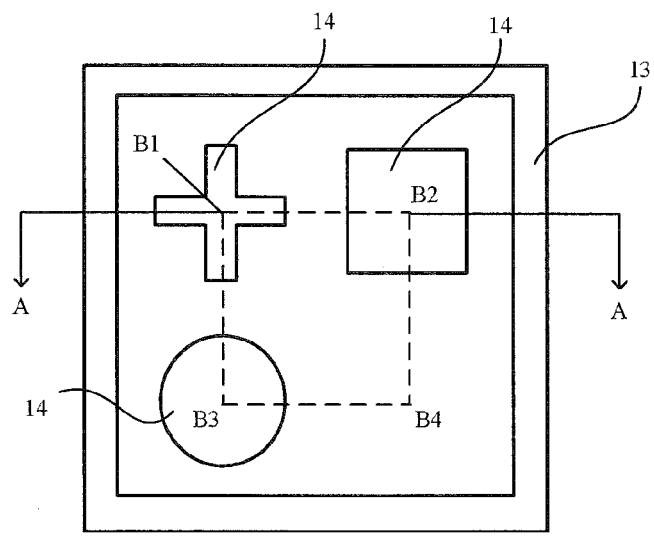
FIG. 2 is a partial schematic view of the OLED backboard according to an embodiment of the present disclosure.
Figure 3:
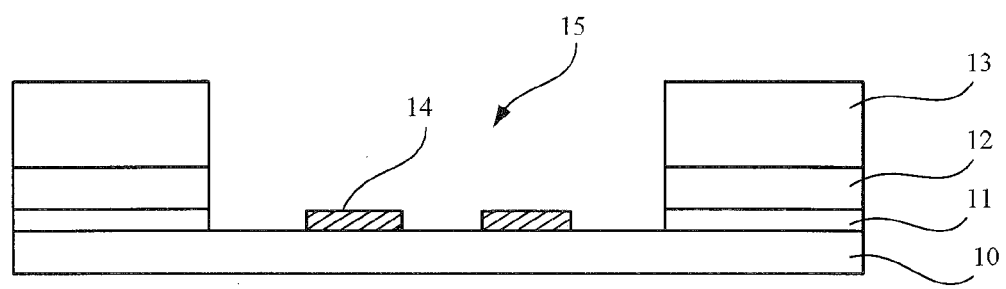
FIG. 3 is a section view taken along the A-A direction of FIG. 2.

Referring to FIGS. 2 and 3, FIG. 2 is a partial schematic view of the OLED backboard according to an embodiment of the present disclosure, that is, a schematic view of an alignment area, and FIG. 3 is a section view taken along the A-A direction of FIG. 2. The OLED backboard according to the embodiment of the present disclosure comprises: a transparent substrate 10, at least two functional layers disposed on the upper surface of the transparent substrate 10 and stacked on each other, at least two via holes 15 extending through the thickness of all the functional layers and communicated with the upper surface of the transparent substrate 10 at its end, and at least two alignment modules disposed on the upper surface of the transparent substrate 10 and located in a corresponding one of the at least two via holes 15 respectively, each of the alignment modules comprising at least three first alignment structures 14 arranged in a predefined trace, wherein a virtual alignment point may be determined according to the relative position among all the first alignment structures 14 in each of the alignment modules.

Figure 4:
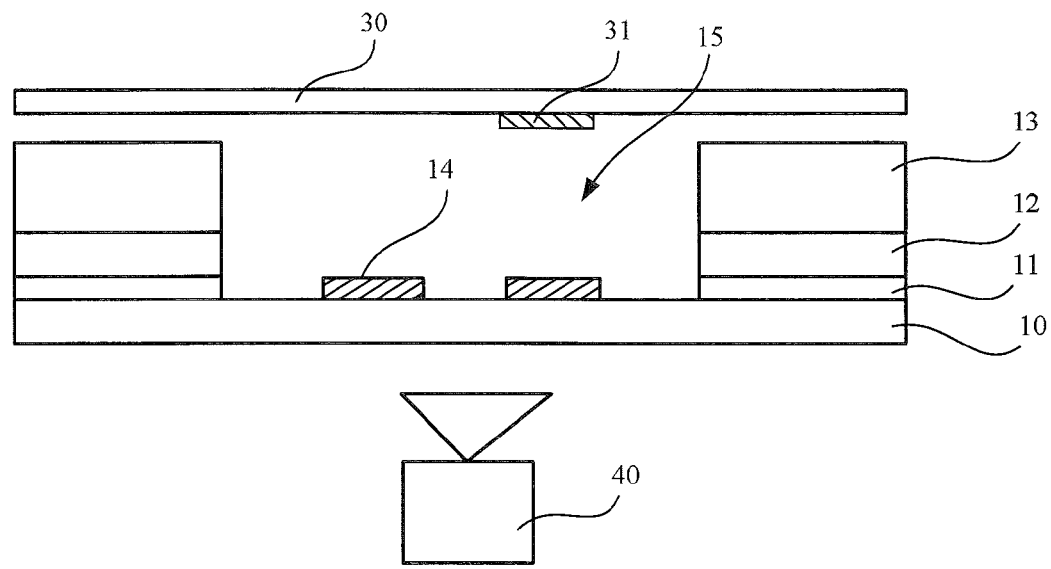
FIG. 4 is a schematic view showing the positional relationship between the OLED backboard and the FMM when a CCD camera is used to shoot.

FIG. 4 is a schematic view showing the positional relationship between the OLED backboard and the FMM when a CCD camera is used to shoot. Referring to FIG. 4, If an organic light-emitting material layer is required to be formed on the OLED backboard, the second alignment structure 31 on the FMM 30 is firstly aligned with the via hole 15 in the OLED backboard to perform an initial alignment; the CCD camera 40 then shoots at a side of the OLED backboard away from the FMM 30 to take an image showing the alignment between the FMM 30 and the OLED backboard. It should be noted that the CCD camera 40 should shoot a range covering at least two alignment modules and the relative position between the CCD camera 40 and the OLED backboard should be constant during each shooting.

Then, a virtual alignment point corresponding to one of alignment modules is determined according to patterns in the alignment image indicating the first alignment structures in the one of alignment modules; a center of a pattern corresponding to one of the second alignment structures 31 is determined according to the pattern in the alignment image indicating the second alignment structure 31. Next, it is decided whether each of the virtual alignment points coincides with the center of the pattern of a corresponding second alignment structure 31; if each of the virtual alignment points coincides with the center of the pattern of a corresponding second alignment structure 31, it indicates that the FMM 30 and the OLED backboard have been aligned with each other and the organic material is then allowed to be evaporated into each of pixel units in the pixel area of the OLED backboard; if none of the virtual alignment points coincides with the center of the pattern of a corresponding second alignment structure 31 or only one of the virtual alignment points coincides with the center of the pattern of a corresponding second alignment structure 31, it indicates that the FMM 30 and the OLED backboard have not been aligned with each other correctly and it is necessary to adjust the position of the FMM 30 relative to the OLED backboard according to the relative position between the center of the pattern of the second alignment structure 31 and the corresponding virtual alignment point in the alignment image, that is, to repeat the above shooting, comparison and adjustment steps until each of the virtual alignment points coincides with the center of the pattern of a corresponding second alignment structure 31.

As can be seen, in the OLED backboard according to the embodiment of the present disclosure, all of the alignment modules are disposed on the upper surface of the transparent substrate 10 and the second alignment structure 31 is just aligned with the via hole 15. The light reflected from all of the first alignment structures 14 and all of the second alignment structures 31 may be directly reflected to the CCD camera 40 through the transparent substrate 10 if the CCD camera 40 shoots from the lower surface of the transparent substrate 10, reducing the times of reflection and refraction for the light greatly, so that there is a big difference between the grayscale of the patterns of the first alignment structures 14 and the second alignment structures 31 and that of the FMM 30 in the alignment image, and it is thus allowed to distinguish the pattern indicating the FMM 30 with the patterns indicating the first alignment structures 14 and the second alignment structures 31 apparently, so as to decide whether the FMM is aligned with the OLED backboard correctly and to obtain the displacement of the FMM 30 relative to the OLED backboard correctly if it is necessary to adjust the position of the FMM 30 relative to the OLED backboard. Therefore, compared with the prior art, the times of the alignment between the FMM 30 and the OLED backboard are greatly reduced, thereby increasing the efficiency of forming the organic light-emitting material layer on the OLED backboard apparently.

Specifically, the transparent substrate 10 may be selected from a glass substrate or a plastic substrate. In order to reduce the thickness of the OLED backboard and lower the power consumption of the OLED backboard, the transparent substrate 10 may optionally be a substrate for preparing low temperature poly-Si (referred to as LTPS). Each of via holes 15 is located at the periphery of the OLED backboard, that is, at the non-display area (non-pixel area) of the OLED backboard, thus the via holes 15 herein extend through the thickness of all the functional layers in the non-display area of the OLED backboard. Typically, the number of the functional layers in the non-display area of the OLED backboard is three, wherein a function layer disposed on the upper surface of the transparent substrate 10 is the gate insulation layer 11, a function layer disposed on the upper surface of the gate insulation layer 11 is a dielectric layer 12 and a function layer disposed on the upper surface of the dielectric layer 12 is a planarization layer 13. It should be noted that there may not be the planarization layer 13 or a buffer layer may further be disposed between the transparent substrate and the gate insulation layer in some OLED backboards.

As a modification or an alternative, the via holes 15 receiving the alignment modules may also only extend through the upper functional layer, for example, when the gate insulation layer 11, the dielectric layer 12 and the planarization layer 13 are laminated on the transparent substrate 10 in one time, the via holes 15 may only extend through the thickness of the dielectric layer 12 and the planarization layer 13 to the upper surface of the gate insulation layer 11, or the via holes 15 may only extend through the thickness of the planarization layer 13 to the upper surface of the dielectric layer 12. In these cases, each of the alignment modules is suitable to reflect the incident light from the lower surface of the transparent substrate, in other words, the lower functional layers through which the via holes do not extend should be transparent so that the light is allowed to penetrate them and reach the alignment modules.

In the above embodiment, the virtual alignment point is determined by using the relative position among all of the first alignment structures 14 in each of alignment modules, so as to decide whether the FMM is aligned with the OLED backboard correctly. Specifically, as shown in FIG. 2, all the first alignment structures 14 may be a cylindrical structure, a cubic structure or a cross structure, or the first alignment structures 14 may be a cylindrical structure, a cubic structure or a cross structure respectively. Each of the first alignment structures 14 comprises a reflective layer which is formed simultaneously with the anode located on the transparent substrate 10. Specifically, when manufacturing the anode on the OLED backboard, a metal film layer is firstly formed on the planarization layer 14 and on the upper surface of transparent substrate 10 in each via hole, the patterns of the anode and each reflective layer are formed through one-time pattern process, that is, each of the first alignment structures 14 is formed simultaneously with the anode, and as the anode has high reflectivity, the reflective layer also has high reflectivity. Similarly, the second alignment structure also comprises a reflective layer with high reflectivity. In such manner, the reflectivity to light for each of the first alignment structures 14 and each of the second alignment structures 31 may be increased, so that there will be a big difference between the gray level of the patterns indicating the first alignment structures 14 and the second alignment structures 31 and that of the pattern indicating the FMM in the taken alignment image, it is thus easy to decide whether the FMM is aligned with the OLED backboard correctly.

In order to facilitate obtaining the virtual alignment point, all of the first alignment structures 14 in each of the alignment modules are arranged in a predefined trace, and some specific arrangements may be provided as follows.

The first arrangement: referring to FIG. 2 again, each of the alignment modules comprises three first alignment structures 14 arranged in a rectangle trace, and centers of the three first alignment structures 14 coincide with corner points B1, B2 and B3 of the rectangle trace respectively, that is, each of the centers of the three first alignment structures 14 corresponds to one of the corner points of the rectangle trace. Thus, after an alignment image is taken by the CCD camera, the patterns indicating the three first alignment structures 14 may be firstly found, so that three centers of the three first alignment structures 14 may be determined as the points B1, B2 and B3 respectively, a rectangle may then be drawn according to the relative position among the points B1, B2 and B3, another corner point B4 of the rectangle is the virtual alignment point.

Figure 5:
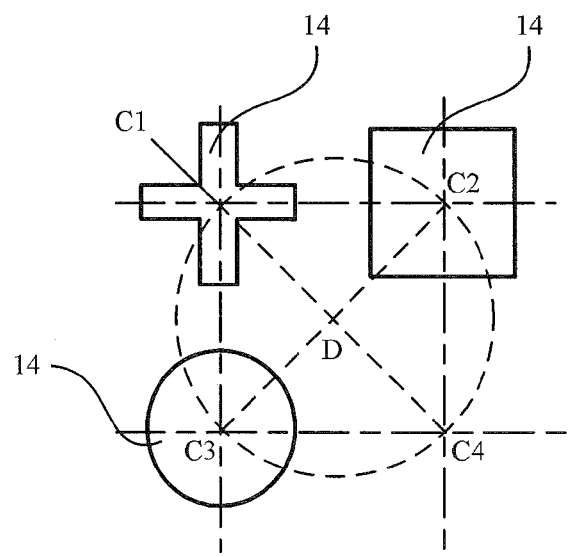
FIG. 5 is a schematic view showing an arrangement of first alignment structures of each of alignment modules in FIG. 2.

The second arrangement: referring to FIG. 5, each of the alignment modules comprises four first alignment structures 14 arranged in a circular trace, and centers of the four first alignment structures 14 quarter the circular trace, the quartering points are points C1, C2, C3 and C4 respectively. Thus, after an alignment image is taken by the CCD camera 40, the patterns indicating the four first alignment structures 14 may be firstly found, so that four centers of the four first alignment structures 14 may be determined as the points C1, C2, C3 and C4 respectively, a position of the center D of the circular trace may then be determined according to the relative position among the points C1, C2, C3 and C4, and the point D is the virtual alignment point.

It should be noted that, the cases in which the number of the first alignment structures 14 is three and four respectively and the predefined traces are rectangle and circle respectively are described in the above two arrangements, however, it is not limited to this, the number of the first alignment structures 14 may equal to and/or more than six, and the predefined trace may be an equilateral polygon which has more than six and even edges, similarly, only one virtual alignment point may also be determined in these cases. For example, the number of the first alignment structures 14 is six, and the six first alignment structures 14 correspond to six corner points of an equilateral hexagon respectively, the intersection point of three diagonals of the equilateral hexagon is the virtual alignment point.

During deciding whether the FMM 30 is aligned with the OLED backboard correctly, a virtual alignment point is determined by using the relative position among all of the first alignment structures 31 in each of the alignment modules, and in order to decide whether the FMM 30 is aligned with the OLED backboard correctly, it is required to ensure that at least two virtual alignment points coincide with the centers of the patterns of the respective second alignment structures 31. Thus, two or more via holes 15 and alignment modules are disposed on the OLED backboard, for example, four via holes 15 are disposed in the OLED backboard, correspondingly, there are four alignment modules, and four virtual alignment points determined by the four alignment modules respectively are connected with each other to form a rectangle. It should be noted that the alignment modules in two via holes located at a diagonal are typically shot during a specific shooting.

Figure 6:
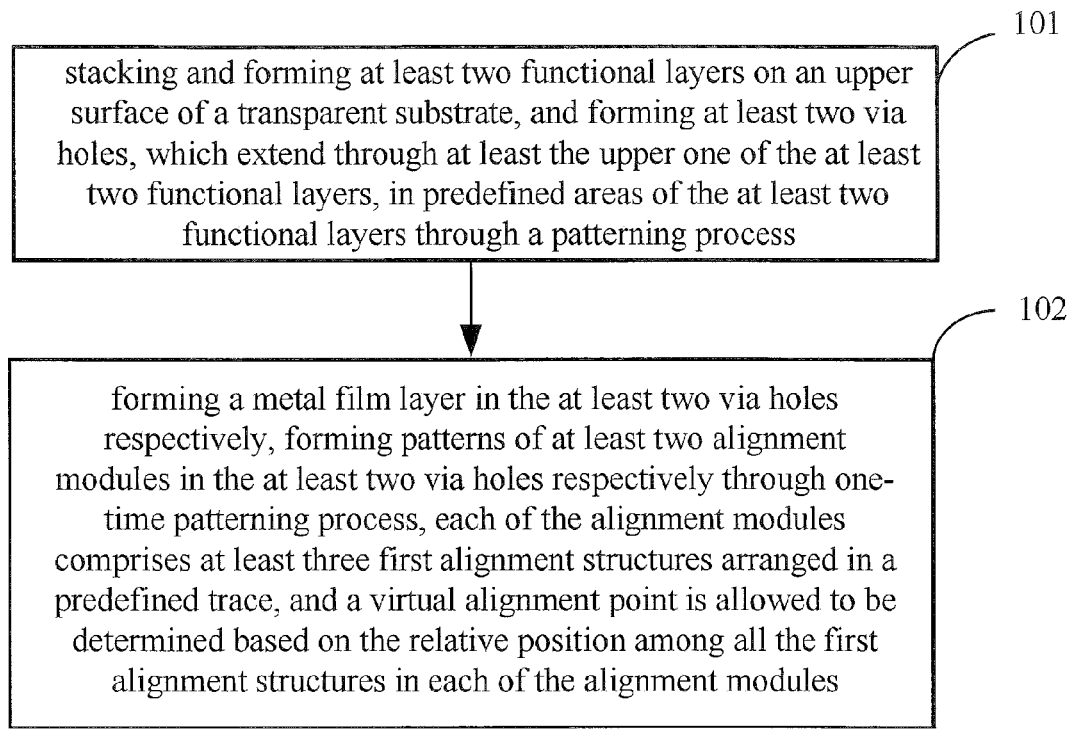
FIG. 6 is a flow chart of manufacturing the OLED backboard according to the embodiment of the present disclosure.

Referring to FIG. 6, an embodiment of the present disclosure further provides a method of manufacturing the OLED backboard comprising the following steps:

Step 101: stacking at least two functional layers on the upper surface of the transparent substrate in sequence, and forming at least two via holes, which extend through the thickness of all of the functional layers to the upper surface of the transparent substrate, in predefined areas of each of the functional layers through a patterning process;

Step 102: forming a metal film layer on the upper surface of the transparent substrate in each of the via holes, and forming patterns including at least two alignment modules through one-time patterning process, each of the alignment modules comprising at least three first alignment structures arranged in a predefined trace and a virtual alignment point being allowed to be determined according to the relative position among all of the first alignment structures in each of the alignment modules. Specifically, forming a metal film layer on the upper surface of the uppermost functional layer through a deposition process, then forming a pattern of the anode required by the OLED backboard and patterns of the alignment modules through some processes such as photoresist coating, mask, exposure, development, etching and the like, that is, forming the alignment module and the anode simultaneously.

In the OLED backboard formed by the above method, each of the alignment modules is disposed on the upper surface of the transparent substrate, and each of the second alignment structures on the FMM is just aligned with the respective via hole when using the FMM. Thus, if the CCD camera shoots from the lower surface of the transparent substrate, the light reflected by each of the first alignment structures and each of the second alignment structures may be directly reflected to the CCD camera from the transparent substrate, thereby reducing the times of reflection and refraction for the light greatly, so that there is a big difference between the grayscale of the patterns of the first alignment structures and the second alignment structures and that of the FMM in the alignment image, and it is thus allowed to distinguish the pattern indicating the FMM with the patterns indicating the first alignment structures and the second alignment structures apparently. Therefore, the times of the alignment between the FMM and the OLED backboard are greatly reduced, thereby increasing the efficiency of forming the organic light-emitting material layer on the OLED backboard apparently.

In a particular implementation, all of the via holes may be formed through one-time patterning process after all of the functional layers have been formed on the transparent substrate, or at least two via holes corresponding to at least two alignment modules respectively may be formed on the current functional layer through one-time patterning process after a functional layer is formed and before next functional layer will be formed, and each of the via holes in each of the functional layers is formed as at least two via holes extending through the thickness of all of the functional layers to the upper surface of the transparent substrate, and one of the alignment modules is positioned in one of the via holes. Specifically, there are three functional layers in the above OLED backboard, wherein a function layer disposed on the upper surface of the transparent substrate is the gate insulation layer, a function layer disposed on the upper surface of the gate insulation layer is a dielectric layer and a function layer disposed on the upper surface of the dielectric layer is a planarization layer. Each of the via holes is manufactured as the following steps:

forming a pattern including at least two first via hole portions on the gate insulation layer through one-time patterning process after forming the gate insulation layer on the upper surface of the transparent substrate;

forming a pattern including at least two second via hole portions, corresponding to the first via hole portions respectively, on the dielectric layer through one-time patterning process after forming the dielectric layer on the upper surface of the gate insulation layer;

forming a pattern including at least two third via hole portions, corresponding to the second via hole portions respectively, on the planarization layer through one-time patterning process after forming the planarization layer on the upper surface of the dielectric layer;

wherein, one first via hole portion, one second via hole portion and one third via hole portion which correspond to each other constitute a via hole.

It should be noted that the second via hole portions formed on the dielectric layer and the first via hole portions formed on the gate insulation layer may also be formed through the following method: stacking and forming the gate insulation layer and the dielectric layer in sequence on the upper surface of the transparent substrate, then forming at least two first via hole portions extending through the thickness of the gate insulation layer and at least two second via hole portions extending through the thickness of the dielectric layer through one-time patterning process, and the second via hole portions corresponding to the first via hole portions respectively. Wherein, the mask used by the patterning process comprises full-tone mask areas for forming the first and second via hole portions and half-tone mask areas corresponding to pixel areas of the transparent substrate. Specifically, etching all the functional layers to form the via holes for receiving the alignment modules, then performing an ashing process and etching the gate insulation layer and the planarization layer in pixel areas to form via holes for pixels.

The above via holes may also be manufactured through the following method: stacking and forming the gate insulation layer, the dielectric layer and the planarization layer in sequence on the upper surface of the transparent substrate, then forming at least two via holes extending through the gate insulation layer, the dielectric layer and the planarization layer to the upper surface of the transparent substrate through one-time patterning process and by extending etching time. Specifically, mask holes for masking the via holes receiving the alignment modules are disposed in a mask for masking the planarization layer, and each of required via holes extending through the planarization layer, the dielectric layer and the gate insulation layer is formed by extending the etching time when masking the planarization layer.

In the OLED backboard manufactured by the above method, each of the first alignment structures comprises a reflective layer which is formed simultaneously with the anode on the transparent substrate, and each of the first alignment structures has the same material as the anode, that is, the first alignment structures are formed simultaneously with the anode and have the same material as the anode. Specifically, when forming the anode of the organic light-emitting structure on the planarization layer, firstly forming the metal film layer simultaneously on the planarization layer and on the upper surface of the transparent substrate in each of via holes, then forming the required anode and all the first alignment structures through one-time patterning process. As the material forming the anode has high reflectivity, all the first alignment structures formed by the material also have high reflectivity, the reflectivity of all the first alignment structures to the light is thus increased, so that there is a big difference between the grayscales of the patterns indicating the first alignment structures and the pattern indicating the FMM in the taken alignment image, and thus it facilitates deciding whether the FMM has been correctly aligned with the OLED backboard.

Figure 7:
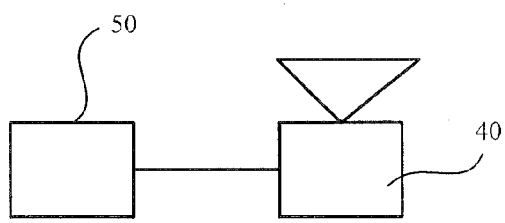
FIG. 7 is a schematic view of an alignment system according to an embodiment of the present disclosure.

Referring to FIG. 7, another embodiment of the present disclosure further provides an alignment system for determining whether the FMM has been correctly aligned with the above OLED backboard, which comprises:

a CCD camera 40 for taking an alignment image of the OLED backboard and the FMM 30, the alignment image comprising patterns indicating all the first alignment structures 14 in each of the alignment modules of the OLED backboard and patterns indicating all the second alignment structures 31 on the FMM 30;

an image processor 50 in a signal connection with the CCD camera 40, the image processor 50 processing the alignment image captured by the CCD camera 40 to determine a virtual alignment point for each of the alignment modules and a center of the pattern for each of the second alignment structures 31, so as to decide whether each of the virtual alignment points coincides with the center of the pattern of each of the second alignment structures 31, and it is determined that the FMM has been correctly aligned with the OLED backboard if each of the virtual alignment points coincides with the center of the pattern of each of the second alignment structures, respectively.

As an example, if the alignment system according to the present embodiment is used to decide whether the FMM 30 has been correctly aligned with the OLED backboard as shown in FIG. 2, firstly, the patterns of three first alignment structures 14 in each of the alignment modules and the pattern of the second alignment structure 31 corresponding to the alignment module may be obtained by the CCD camera 40; then, the alignment image captured by the CCD camera 40 is processed by the image processor 50 to determine centers of the patterns of the three first alignment structures 14 as points B1, B2 and B3, and a rectangle passing through the points B1, B2 and B3 may be fabricated based on coordinates (horizontal coordinates and vertical coordinates) of the centers of the patterns of the three first alignment structures 14, and another corner point B4 of the rectangle is the virtual alignment point. Similarly, a center of the pattern of the second alignment structure 31 may be determined based on the pattern of the second alignment structure 31 in the FMM 30. After the virtual alignment point in each of the alignment modules and the center of the pattern of the respective second alignment structure have been determined by the image processor 50, it is decided whether each of the virtual alignment points B4 coincides with the center of the pattern of the respective second alignment structure 31 or whether the coordinate of each of the virtual alignment points B4 is same as that of the center of the pattern of the respective second alignment structure 31; and it is determined that the FMM 30 has been correctly aligned with the OLED backboard if each of the virtual alignment points B4 coincides with the center of the pattern of the respective second alignment structure 31.

Therefore, if the alignment system according to the embodiment is used to decide whether the FMM 30 has been correctly aligned with the OLED backboard, the times of the alignment between the FMM 30 and the OLED backboard are greatly reduced, thereby increasing the efficiency of forming the organic light-emitting material layer on the OLED backboard apparently.

Figure 8:
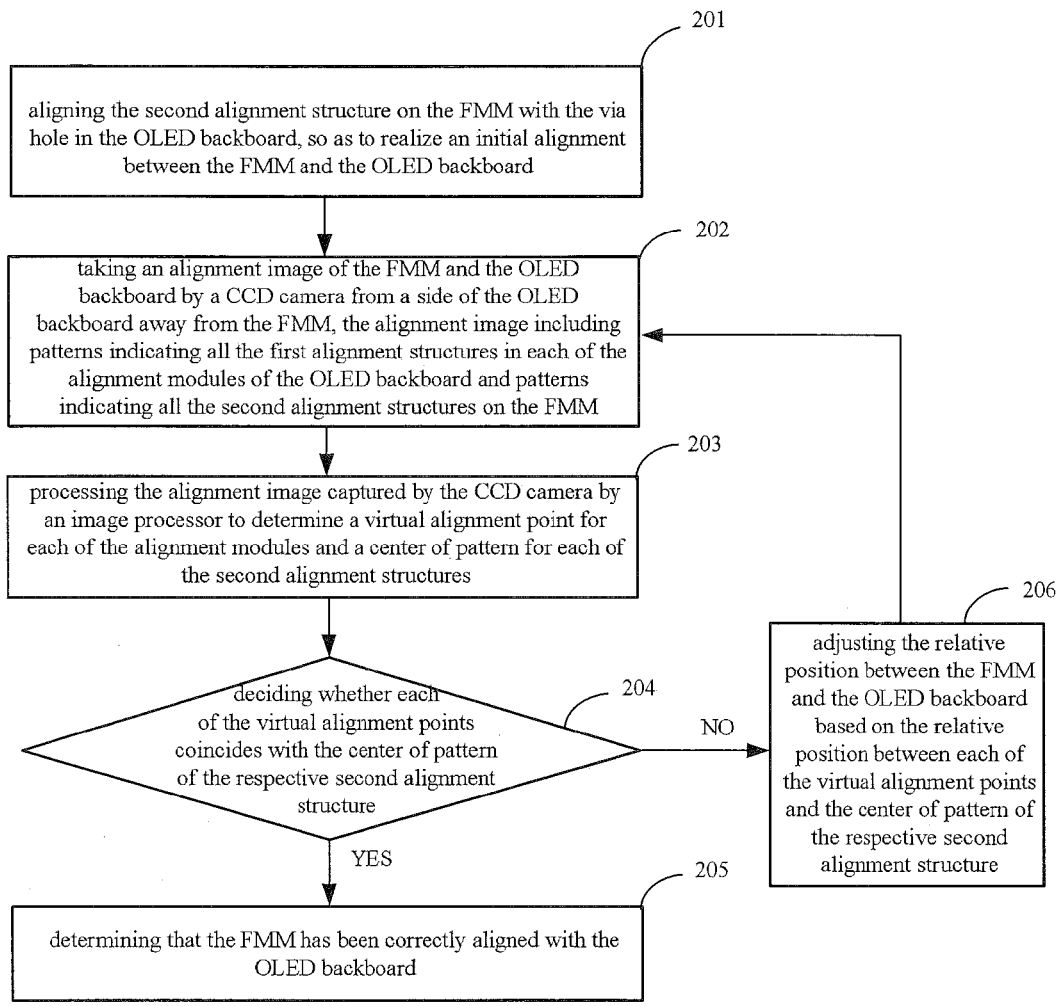
FIG. 8 is a flow chart of an alignment method according to an embodiment of the present disclosure.

Referring to FIG. 8, another embodiment of the present disclosure further provides an alignment method in which the above alignment system is used to realize a correct alignment between the FMM 30 and the OLED backboard, the alignment method comprising:

Step 301: aligning the second alignment structure 31 on the FMM 30 with the via hole in the above OLED backboard to realize an initial alignment between the FMM 30 and the OLED backboard;

Step 302: taking an alignment image of the FMM 30 and the OLED backboard by the CCD camera 40 from a side of the OLED backboard away from the FMM 30, the alignment image including patterns indicating all the first alignment structures 14 in each of the alignment modules of the OLED backboard and patterns indicating all the second alignment structures 31 on the FMM;

Step 303: processing the alignment image captured by the CCD camera by the image processor 50 to determine a virtual alignment point for each of the alignment modules and a center of pattern for each of the second alignment structures 31;

Step 304: deciding whether each of the virtual alignment points coincides with the center of pattern of the respective second alignment structure 31;

Step 305: determining the FMM 30 has been correctly aligned with the OLED backboard if each of the virtual alignment points coincides with the center of pattern of the respective second alignment structure 31;

Step 306: if none or only one of the virtual alignment points coincides with the center of pattern of the respective second alignment structure 31, adjusting the relative position between the FMM 30 and the OLED backboard based on the relative position between each of the virtual alignment points and the center of pattern of the respective second alignment structure 31, then repeating the step 302 until it is determined that the FMM 30 has been correctly aligned with the OLED backboard.

If the alignment method according to the embodiment is used to decide whether the FMM 30 has been correctly aligned with the OLED backboard, the times of the alignment between the FMM 30 and the OLED backboard are greatly reduced, thereby increasing the efficiency of forming the organic light-emitting material layer on the OLED backboard apparently.

In the descriptions of the above embodiments, specific features, structures, material or characteristics may be combined in a suitable manner in any of one or more embodiments or examples.

The above descriptions are only particular embodiments of the present invention, and the scope of the present invention is not limited to this. Those skilled in the art can readily envisage changes or alternatives within the technical scope disclosed by the present invention, which should be included in the scope of the present invention. Therefore, the scope of the present invention will be defined by the appended claims.

What is claimed is:
1. An OLED backboard comprising:
a transparent substrate;
at least two functional layers disposed on the upper surface of the transparent substrate and stacked on each other;

at least two via holes formed in predefined areas of the at least two functional layers and extending through at least the upper one of the at least two functional layers; and at least two alignment modules located in the at least two via holes respectively, wherein each of the at least two alignment modules comprises at least three first alignment structures arranged in a predefined trace, and a virtual alignment point is allowed to be determined based on the relative position among all the first alignment structures in each of the alignment modules, and each of the alignment modules is suitable to reflect an incident light from the lower surface of the transparent substrate.

2. The OLED backboard according to claim 1, wherein, each of the via holes extends through the thickness of all the functional layers and communicates with the upper surface of the transparent substrate at its end;
the at least two alignment modules are disposed on the upper surface of the transparent substrate directly.

3. The OLED backboard according to claim 2, wherein, each of the first alignment structures comprises a reflective layer which is formed simultaneously with an anode on the transparent substrate.

4. The OLED backboard according to claim 2, wherein, the number of the functional layers is three, wherein a function layer disposed on the upper surface of the transparent substrate is a gate insulation layer, a function layer disposed on the upper surface of the gate insulation layer is a dielectric layer and a function layer disposed on the upper surface of the dielectric layer is a planarization layer.

5. The OLED backboard according to claim 2, wherein, the number of the via holes and the alignment modules is four respectively, and four virtual alignment points determined by the four alignment modules are connectable to each other to form a rectangle.

6. The OLED backboard according to claim 1, wherein, each of the alignment modules comprises three first alignment structures arranged in a rectangle trace, and the center of each of the three first alignment structures corresponds to a corner point of the rectangle trace, respectively.

7. The OLED backboard according to claim 6, wherein, each of the first alignment structures comprises a reflective layer which is formed simultaneously with an anode on the transparent substrate.

8. The OLED backboard according to claim 1, wherein, each of the alignment modules comprises four first alignment structures arranged in a circular trace, and centers of the four first alignment structures quarter the circular trace.

9. The OLED backboard according to claim 8, wherein, each of the first alignment structures comprises a reflective layer which is formed simultaneously with an anode on the transparent substrate.

10. The OLED backboard according to claim 1, wherein, each of the first alignment structures comprises a reflective layer which is formed simultaneously with an anode on the transparent substrate.

11. The OLED backboard according to claim 1, wherein, the number of the functional layers is three, wherein a function layer disposed on the upper surface of the transparent substrate is a gate insulation layer, a function layer disposed on the upper surface of the gate insulation layer is a dielectric layer and a function layer disposed on the upper surface of the dielectric layer is a planarization layer.

12. The OLED backboard according to claim 1 wherein, the number of the via holes and the alignment modules is four respectively, and four virtual alignment points determined by the four alignment modules are connectable to each other to form a rectangle.

13. An alignment system for determining whether a fine metal mask (FMM) is correctly aligned with an OLED backboard according to claim 1, the alignment system comprising:

a CCD camera for taking an alignment image of the FMM and the OLED backboard, the alignment image comprising patterns indicating all the first alignment structures in each of the alignment modules of the OLED backboard and patterns indicating all the second alignment structures on the FMM;

an image processor in a signal connection with the CCD camera, the image processor processing the alignment image captured by the CCD camera to determine a virtual alignment point for each of the alignment modules and a center of the pattern for each of the second alignment structures, so as to decide whether each of the virtual alignment points coincides with the center of the pattern of a respective second alignment structure, and to determine that the FMM has been correctly aligned with the OLED backboard if each of the virtual alignment points coincides with the center of the pattern of the respective second alignment structures.

14. A method of manufacturing an OLED backboard, comprising steps of:

stacking and forming at least two functional layers on an upper surface of a transparent substrate, and forming at least two via holes, which extend through at least the upper one of the at least two functional layers, in predefined areas of the at least two functional layers through a patterning process;

forming a metal film layer in the at least two via holes respectively, then forming patterns of at least two alignment modules in the at least two via holes respectively through one-time patterning process, wherein each of the alignment modules comprises at least three first alignment structures arranged in a predefined trace, and a virtual alignment point is allowed to be determined based on the relative position among all the first alignment structures in each of the alignment modules, and each of the alignment modules is suitable to reflect an incident light from the lower surface of the transparent substrate.

15. The method of manufacturing an OLED backboard according to claim 14, wherein, the at least two via holes are formed in predefined areas of all the functional layers through the patterning process so as to extend through the thickness of all the functional layers to the upper surface of the transparent substrate;

the metal film layer is formed on the upper surface of the transparent substrate in all the via holes.

16. The method of manufacturing an OLED backboard according to claim 14, wherein, the number of the functional layers is three, wherein a function layer formed on the upper surface of the transparent substrate is a gate insulation layer, a function layer formed on the upper surface of the gate insulation layer is a dielectric layer and a function layer formed on the upper surface of the dielectric layer is a planarization layer.

17. The method of manufacturing an OLED backboard according to claim 16, wherein, the method of manufacturing the via holes comprising steps of:
   forming a pattern including at least two first via hole portions on the gate insulation layer through one-time patterning process after forming the gate insulation layer on the upper surface of the transparent substrate;
   forming a pattern including at least two second via hole portions, corresponding to the first via hole portions respectively, on the dielectric layer through one-time patterning process after forming the dielectric layer on the upper surface of the gate insulation layer;
   forming a pattern including at least two third via hole portions, corresponding to the second via hole portions respectively, on the planarization layer through one-time patterning process after forming the planarization layer on the upper surface of the dielectric layer;
   wherein one first via hole portion, one second via hole portion and one third via hole portion which correspond to each other constitute the via hole.

18. The method of manufacturing an OLED backboard according to claim 17, wherein the first and second via hole portions are formed through one-time patterning process, comprising steps of:
   stacking and forming the gate insulation layer and the dielectric layer in sequence on the upper surface of the transparent substrate;
   forming at least two first via hole portions extending through the thickness of the gate insulation layer and at least two second via hole portions extending through the thickness of the dielectric layer, the second via hole portions corresponding to the first via hole portions respectively;
   wherein, the mask used by the patterning process comprises full-tone mask areas for forming the first and second via hole portions and half-tone mask areas corresponding to pixel areas of the transparent substrate.

19. The method of manufacturing an OLED backboard according to claim 6, wherein, the method of manufacturing the via holes comprising steps of:
   stacking and forming the gate insulation layer, the dielectric layer and the planarization layer in sequence on the upper surface of the transparent substrate, then forming at least two via holes extending through the gate insulation layer, the dielectric layer and the planarization layer to the upper surface of the transparent substrate through one-time patterning process and by extending etching time.

20. The method of manufacturing an OLED backboard according to claim 14, wherein,
   each of the first alignment structures comprises a reflective layer which is formed simultaneously with an anode on the transparent substrate.

* * * * *